United States Patent
Ohguro et al.

(10) Patent No.: US 9,318,615 B2
(45) Date of Patent: Apr. 19, 2016

(54) SEMICONDUCTOR DEVICE AND METHOD FOR FABRICATING SEMICONDUCTOR DEVICE

(71) Applicant: KABUSHIKI KAISHA TOSHIBA, Minato-ku, Tokyo (JP)

(72) Inventors: Tatsuya Ohguro, Yokohama (JP); Hisayo Momose, Yokohama (JP); Tetsu Morooka, Yokohama (JP); Kazuya Fukase, Hachioji (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/318,207

(22) Filed: Jun. 27, 2014

(65) Prior Publication Data

US 2015/0249156 A1  Sep. 3, 2015

(30) Foreign Application Priority Data

Feb. 28, 2014 (JP) ................................. 2014-038208

(51) Int. Cl.
*H01L 29/10* (2006.01)
*H01L 29/66* (2006.01)
*H01L 29/786* (2006.01)

(52) U.S. Cl.
CPC ........ *H01L 29/7869* (2013.01); *H01L 29/1054* (2013.01); *H01L 29/66969* (2013.01)

(58) Field of Classification Search
CPC ..................... H01L 29/7869; H01L 29/66969; H01L 29/1054
See application file for complete search history.

(56) References Cited

U.S. PATENT DOCUMENTS

| 7,884,360 | B2 | 2/2011 | Takechi et al. | |
|---|---|---|---|---|
| 8,143,678 | B2 | 3/2012 | Kim et al. | |
| 8,344,373 | B2 | 1/2013 | Sato et al. | |
| 2003/0218222 | A1* | 11/2003 | Wager, III | H01L 29/02 257/410 |
| 2010/0084655 | A1* | 4/2010 | Iwasaki et al. | 257/43 |
| 2011/0073856 | A1* | 3/2011 | Sato et al. | 257/43 |
| 2013/0221345 | A1* | 8/2013 | Ohno | H01L 29/78693 257/43 |

FOREIGN PATENT DOCUMENTS

| JP | 2008042088 A | 2/2008 |
|---|---|---|
| JP | 2008199005 A | 8/2008 |
| WO | 2011039853 A1 | 4/2011 |

* cited by examiner

*Primary Examiner* — Victor A Mandala
*Assistant Examiner* — Quovaunda V Jefferson
(74) *Attorney, Agent, or Firm* — Holtz, Holtz & Volek PC

(57) ABSTRACT

A semiconductor device according to an embodiment includes a gate electrode, a first dielectric film, an oxide semiconductor film, a second dielectric film, a source electrode and a drain electrode. The first dielectric film is placed above the gate electrode. The oxide semiconductor film is placed above the first dielectric film. The oxide semiconductor film is formed to have a film thickness in a first contact region in contact with the source electrode and a second contact region in contact with the drain electrode larger than a film thickness in a channel region of the oxide semiconductor film so that a film portion of the first contact region projects toward the source electrode side and a film portion of the second contact region projects toward the drain electrode side.

25 Claims, 14 Drawing Sheets

SEMICONDUCTOR DEVICE AND METHOD FOR FABRICATING SEMICONDUCTOR DEVICE

CROSS-REFERENCE TO RELATED APPLICATION

This application is based upon and claims the benefit of priority from Japanese Patent Application No. 2014-038208 filed on Feb. 28, 2014 in Japan, the entire contents of which are incorporated herein by reference.

FIELD

Embodiments described herein relate generally to a semiconductor device and a method for fabricating a semiconductor device.

BACKGROUND

In recent years, a thin film transistor (TFT) including an oxide semiconductor film such as InGaZnO, which is oxide of indium (In), gallium (Ga) and zinc (Zn) has been developed. It is known that the InGaZnO thin film transistor can be easily fabricated at a low temperature, and the InGaZnO thin film has a high mobility of 10 $cm^2/Vs$ or more. Therefore, realization of a back end of line (BEOL) transistor, which is embedded in multilayer interconnection, has been expected. Furthermore, application to liquid crystal panels, and the like has been expected. In addition, it is known that the channel region of an InGaZnO-TFT is not an inversion layer but a storage layer unlike a silicon (Si) metal oxide semiconductor field effect transistor (MOSFET) or a Si-TFT.

Meanwhile, the channel length is getting shorter along with recent fining of patterns, and the shortening of the channel length causes a problem of significant deterioration of the threshold voltage of a TFT. For example, a threshold voltage around 0 V may be changed to −10 V or lower.

DETAILED DESCRIPTION

A semiconductor device according to an embodiment includes a gate electrode, a first dielectric film, an oxide semiconductor film, a second dielectric film, a source electrode and a drain electrode. The first dielectric film is placed above the gate electrode. The oxide semiconductor film is placed above the first dielectric film. The second dielectric film is placed above the oxide semiconductor film. The source electrode is placed in the second dielectric film and connected to the oxide semiconductor film. The drain electrode is placed in the second dielectric film and connected to the oxide semiconductor film. The oxide semiconductor film is formed to have a film thickness in a first contact region in contact with the source electrode and a second contact region in contact with the drain electrode larger than a film thickness in a channel region of the oxide semiconductor film so that a film portion of the first contact region projects toward the source electrode side and a film portion of the second contact region projects toward the drain electrode side.

A method for fabricating a semiconductor device according to an embodiment includes forming a gate electrode, forming a first dielectric film above the gate electrode, forming a first oxide semiconductor film above the first dielectric film, selectively forming a second oxide semiconductor film on one end side and on another end side of the first oxide semiconductor film, and respectively forming a source electrode on the second oxide semiconductor film on the one end side and a drain electrode on the second oxide semiconductor film on the another end side.

Hereinafter, semiconductor devices capable of suppressing deterioration of threshold voltage will be described in embodiments.

First Embodiment

Hereinafter, a first embodiment will be described with reference to the accompanying drawings.

Figure 1:
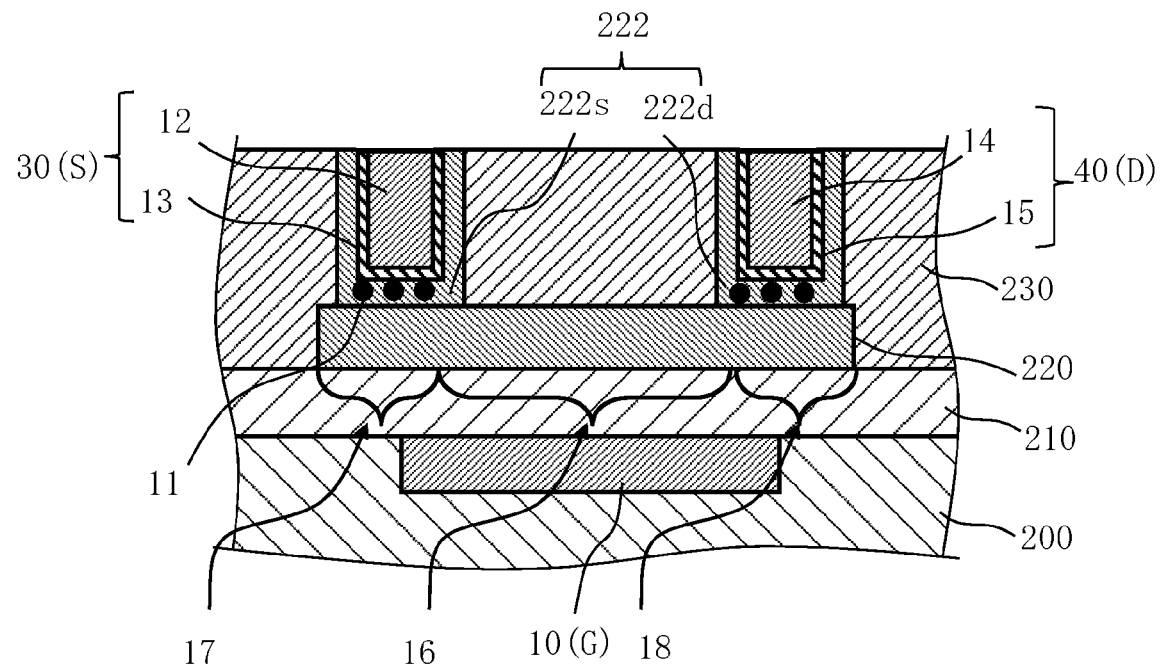
FIG. 1 is a sectional view illustrating a structure of a semiconductor device according to the first embodiment.

FIG. 1 is a sectional view illustrating a structure of a semiconductor device according to the first embodiment. FIG. 1 illustrates, as a semiconductor device, an example of a bottom-gate TFT including an oxide semiconductor film such as an InGaZnO film (IGZO film). In FIG. 1, a gate electrode 10 is formed in a substrate 200. In the example of FIG. 1, the gate electrode 10 is embedded in such a manner that a surface (upper surface) of the gate electrode 10 is formed at the height identical to that of the upper surface of the substrate 200. In the example of FIG. 1, there is assumed, for example, a case where the gate electrode 10 is formed in the layer identical to that of a predetermined wire in multilayer interconnection. Thus, other wiring layers, a semiconductor element, and the like may be formed on the substrate 200. However, the structure of the semiconductor device is not limited to that described above, and the gate electrode 10 may be formed on the substrate 200.

On the gate electrode 10, a gate dielectric film 210 (first dielectric film) is placed. The gate dielectric film 210 is formed on the gate electrode 10 and the substrate 200. On the gate dielectric film 210, an oxide semiconductor film 220 (first oxide semiconductor film) is placed. As the oxide semiconductor film 220, an InGaZnO film, or the like may be preferably used. Other than an InGaZnO film, an InZnO film, a ZnO film, a ZnAlO film, a ZnCuO film, a NiO film, a SnO film, a CuO film, an InO film, or the like may be used. The oxide semiconductor film 220 may be preferably formed to have a width larger than the width of the gate electrode 10 in the gate length direction, for example.

On the oxide semiconductor film 220, a dielectric film 230 (second dielectric film) is placed. The dielectric film 230 is formed also on the gate dielectric film 210 while covering the oxide semiconductor film 220.

On one end side of the oxide semiconductor film 220, an oxide semiconductor film 222s (an example of a second oxide semiconductor film 222) is placed to cover the side surfaces and the bottom surface of a source electrode 30. The source electrode 30 is connected to the one end side of the oxide semiconductor film 220 via the oxide semiconductor film 222s. The source electrode 30 and the oxide semiconductor film 222s are placed in the dielectric film 230. The source electrode 30 is connected to the oxide semiconductor film 220 via the oxide semiconductor film 222s at a position where at least a part of the source electrode 30 overlaps with one end of the gate electrode 10 in the gate length direction.

In addition, on the other end side of the oxide semiconductor film 220, an oxide semiconductor film 222d (another example of the second oxide semiconductor film 222) covering the side surfaces and the bottom surface of a drain electrode 40 is placed. The drain electrode 40 is connected to the other end side of the oxide semiconductor film 220 via the oxide semiconductor film 222d. The drain electrode 40 and the oxide semiconductor film 222d are placed in the dielectric film 230. The drain electrode 40 is connected to the oxide semiconductor film 220 via the oxide semiconductor film 222d at a position where at least a part of the drain electrode 40 overlaps with the other end of the gate electrode 10 in the gate length direction.

As the oxide semiconductor film 222, an InGaZnO, or the like film may be preferably used. Other than an InGaZnO film, an InZnO film, a ZnO film, a ZnAlO film, a ZnCuO film, a NiO film, a SnO film, a CuO film, an InO film, or the like may be used. The oxide semiconductor film 222 is preferably formed of a material identical to that of the oxide semiconductor film 220, but they may be formed of different materials as long as they are oxide semiconductors.

The source electrode 30 includes an electrode material film 12 as a main material and a barrier metal film 13 covering the side surfaces and the bottom surface of the electrode material film 12. Similarly, the drain electrode 40 includes an electrode material film 14 as a main material and a barrier metal film 15 covering the side surfaces and the bottom surface of the electrode material film 14.

As described above, in the first embodiment, the oxide semiconductor films 220 and 222 are formed as a multilayer film in a contact region 17 (first contact region) in contact with the source electrode 30 and a contact region 18 (second contact region) in contact with the drain electrode 40. Thus, the contact regions 17 and 18 are respectively formed to have a film thickness larger than that of a channel region 16 where a single-layer film of the oxide semiconductor film 220 is formed so that a film portion of the contact region 17 projects toward the source electrode 30 side and a film portion of the contact region 18 projects toward the drain electrode 40 side.

More specifically, in the first embodiment, the oxide semiconductor film 220 (first oxide semiconductor film) is placed on the contact region 17 in contact with, or connected to, the source electrode 30, the contact region 18 in contact with, or connected to, the drain electrode 40, and the channel region 16 of the oxide semiconductor film 220. The oxide semiconductor film 222 (second oxide semiconductor film) is then placed on the oxide semiconductor film 220 on the contact region 17 in contact with, or connected to, the source electrode 30 and on the contact region 18 in contact with, or connected to, the drain electrode 40. In other words, the oxide semiconductor films 222s and 222d are formed in such a manner that they are not placed on the channel region 16 of the oxide semiconductor film 220. On parts of the channel region 16 on the source electrode 30 side and the drain electrode 40 side, the oxide semiconductor film 222 may be formed.

Figure 2:
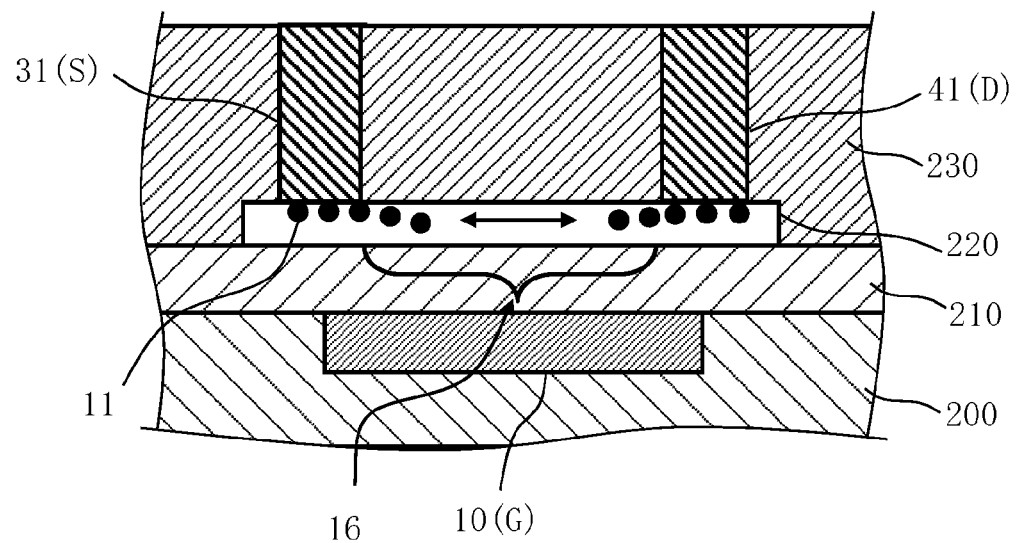
FIG. 2 is a sectional view illustrating a structure example of a semiconductor device as a comparative example of the first embodiment.

FIG. 2 is a sectional view illustrating a structure example of a semiconductor device as a comparative example of the first embodiment. In FIG. 2, as a semiconductor device of the comparative example, an example of a bottom-gate TFT including an oxide semiconductor film such as an IGZO film is illustrated. FIG. 2 illustrates a structure of the first embodiment illustrated in FIG. 1, but without the oxide semiconductor film 222s or 222d. In other words, a source electrode 31 and a drain electrode 41 are directly connected to the oxide semiconductor film 220. Note that, in the comparative example of FIG. 2, barrier metal films in the source electrode 31 and the drain electrode 41 are not illustrated in the figure. By heating (annealing treatment, for example) with an electrode material (barrier metal film) of the source electrode 31 and the drain electrode 41 in contact with the oxide semiconductor film 220, reactants 11 are formed through, for example, reduction reaction therebetween. It is known, from an experiment and the like, that the reactants 11 decrease oxygen concentration in the vicinity of the interface between the electrode material (barrier metal film) and the oxide semiconductor film 220. The reactants 11 diffuse (penetrates) in the oxide semiconductor film 220 at least along the interface between the electrode material (barrier metal film) and the oxide semiconductor film 220 in the gate length direction (horizontal direction), and the reactants 11 unfortunately connect the source and the drain. In other words, the reactants 11 unfortunately function as a hole trap.

Figure 3:
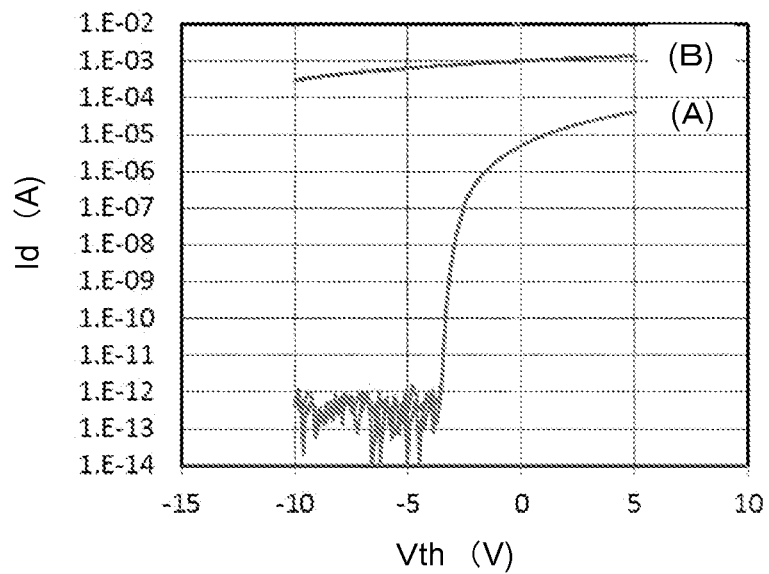
FIG. 3 is a view illustrating an example of change of a threshold voltage in the comparative example of the first embodiment.

FIG. 3 is a view illustrating an example of change of a threshold voltage in the comparative example of the first embodiment. In FIG. 3, bottom-gate TFTs (A) and (B) including IGZO films having been annealed for 30 minutes at 420° C. in nitride ($N_2$) atmosphere are compared. The TFT (A) is formed to have a long gate length. The gate length is set to, for example, 13 μm. The TFT (A) is fabricated in such a manner that the threshold voltage Vth, at which the gate turns on the TFT (A), is set to, for example, about −3 V as illustrated in a graph (A) in FIG. 3. Shortening of the gate length along with recent fining of patterns significantly changes threshold voltage Vth. The TFT (B) is also fabricated in such a manner that the threshold voltage Vth, at which the gate turns on the TFT (A), is set to, for example, about −3 V similarly to the TFT (A). However the TFT (B) is formed to have the gate length of 1 μm or less. Thus, the threshold voltage Vth is degraded and significantly low as illustrated by a graph (B) in FIG. 3. From the graph (B) in FIG. 3, it is known that the threshold voltage is lower than measurement limit (−10 V). Such degradation of the threshold voltage Vth is caused by the fact that the reactants 11 connect the source and the drain as described above. It is considered that the connection between the source and the drain by the reactants 11 degrade heat resistance and causes such degradation of the threshold voltage Vth.

Figure 4:
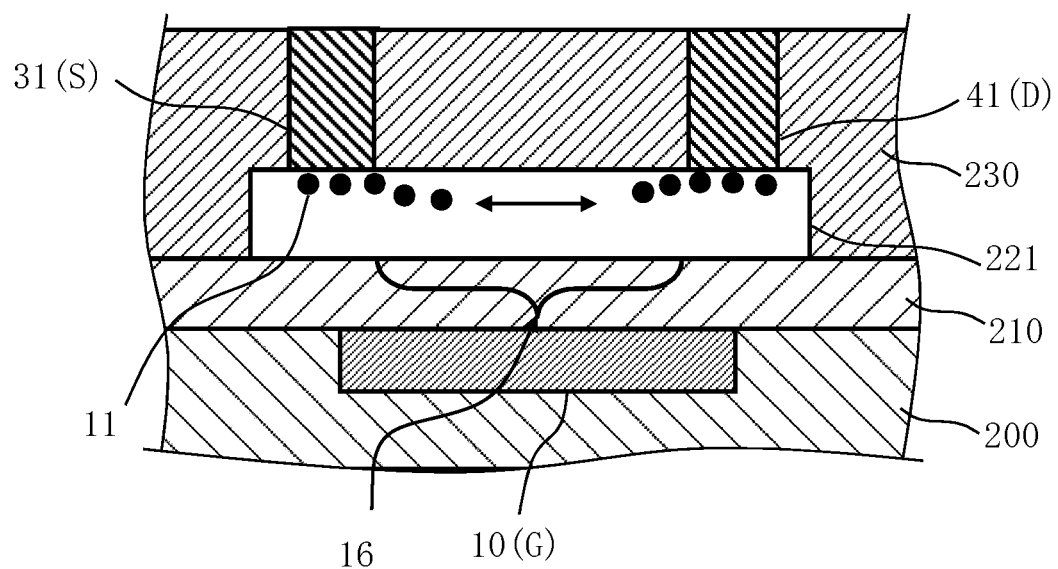
FIG. 4 is a sectional view illustrating another structure example of a semiconductor device according to a comparative example of the first embodiment.

FIG. 4 is a sectional view illustrating another structure example of a semiconductor device according to a comparative example of the first embodiment. In the comparative example illustrated in FIG. 4, the film thickness of the oxide semiconductor film 221 is larger than that of the oxide semiconductor film 220 of the comparative example illustrated in FIG. 2. Even with the oxide semiconductor film 221 having the larger thickness, the threshold voltage Vth is deteriorated through heating (annealing treatment, for example) in a state where an electrode material (barrier metal film) of the source electrode 31 and the drain electrode 41 is in contact with the oxide semiconductor film 221. From the above result, it is known that the reactants 11 diffuse (penetrate) in the oxide semiconductor film 220 (221) along the interface between the electrode material (barrier metal film) and the oxide semiconductor film 220 (221) in the gate length direction (horizontal direction), and unfortunately connect the source and the drain.

Therefore, in the first embodiment, the semiconductor device is structured in such a manner that the interface portion between the electrode material (the barrier metal film 13) of the source electrode 30 and the oxide semiconductor film 222s (third oxide semiconductor film) and the interface portion between the electrode material (the barrier metal film 15) of the drain electrode 40 and the oxide semiconductor film 222d (fourth oxide semiconductor film) are insulated and not connected in the gate length direction (horizontal direction). In the example of FIG. 1, the side surfaces and the bottom surface of the source electrode 30 are covered with the oxide semiconductor film 222s. Thus, the reactants 11 may be formed in the interface portion of the electrode material (barrier metal film 13) of the source electrode 30 and the oxide semiconductor film 222s. Similarly, the side surfaces and the bottom surface of the drain electrode 40 are covered with the oxide semiconductor film 222d. Thus, the reactants 11 may be formed in the interface portion of the electrode material (the barrier metal film 15) and the oxide semiconductor film 222d. However, in the example of FIG. 1, the oxide semiconductor film 222s and the oxide semiconductor film 222d are not connected in the gate length direction (horizontal direction), enabling prevention of connection of the reactants 11. As a result, degradation of the threshold voltage Vth can be prevented or reduced even when the semiconductor device is formed to have the gate length of 1 μm or less, and even when the semiconductor device is heated (annealed, for example) with the electrode materials (the barrier metal films 13 and 15) of the source electrode 30 and the drain electrode 40 in contact with the oxide semiconductor film 222.

In addition, it is preferable to form the semiconductor device in such a manner that the oxygen concentration of an upper portion of the contact region 17 of a set of the oxide semiconductor films 220 and 222 connected to the source electrode 30 and the oxygen concentration of an upper portion of the contact region 18 of a set of the oxide semiconductor films 220 and 222 connected to the drain electrode 40 are higher than the oxygen concentration of the channel region 16 of the oxide semiconductor film 220, the upper portions being at positions higher than the upper surface of the channel region 16. In other words, it is preferable to set the oxygen concentration of the oxide semiconductor film 222s connected to the source electrode 30 to be higher than the oxygen concentration of the oxide semiconductor film 220. Similarly, it is preferable to set the oxygen concentration of the oxide semiconductor film 222d connected to the drain electrode 40 to be higher than the oxide semiconductor film 220. As described above, in the vicinity of the interface between the electrode material (barrier metal film) and the oxide semiconductor film 220, the oxygen concentration is decreased due to reaction thereof. Thus, the reactants 11 highly possibly diffuse in search of oxygen. Therefore, in the first embodiment, the oxygen concentration of the oxide semiconductor films 222s and 222d are set to high. Thus, diffusion of the reactants 11 can be prevented or suppressed since oxygen is supplied and diffusion is not necessary. On the other hand, the oxide semiconductor film 220 in the channel region 16 is set to have an oxygen concentration that is desirable for the semiconductor device to function as a TFT. Therefore, the oxide semiconductor films 222s and 222d are formed to have the oxygen concentration higher than that of the oxide semiconductor film 220. The above-described control of oxygen concentration is not necessary, but can exhibit more effect if performed.

In addition, it is preferable to form the semiconductor device in such a manner that the nitrogen concentration of an upper portion of the contact region 17 of the set of the oxide semiconductor films 220 and 222 connected to the source electrode 30 and an upper portion of the contact region 18 of the set of the oxide semiconductor films 220 and 222 connected to the drain electrode 40 are higher than the nitrogen concentration of the channel region 16 of the oxide semiconductor film 220, the upper portions being at positions higher than the upper surface of the channel region 16. In other words, it is preferable to set the nitrogen concentration of the oxide semiconductor film 222s connected to the source electrode 30 to be higher than the nitrogen concentration of the oxide semiconductor film 220. Similarly, it is preferable to set the nitrogen concentration of the oxide semiconductor film 222d connected to the drain electrode 40 to be higher than the oxide semiconductor film 220. Increase of the nitrogen concentration in the vicinity of the interface between the electrode material (barrier metal film) and the oxide semiconductor film 222 can decrease reaction itself. Therefore, diffusion of the reactants 11 can be suppressed. The above-described control of nitrogen concentration is not necessary, but can exhibit more effect if performed.

The first embodiment includes a case where both of the oxygen concentration control and nitrogen concentration control are performed, a case where either one of them is performed, and a case where neither of them is performed. Hereinafter, a method for fabricating the semiconductor device will be described.

Figure 5:
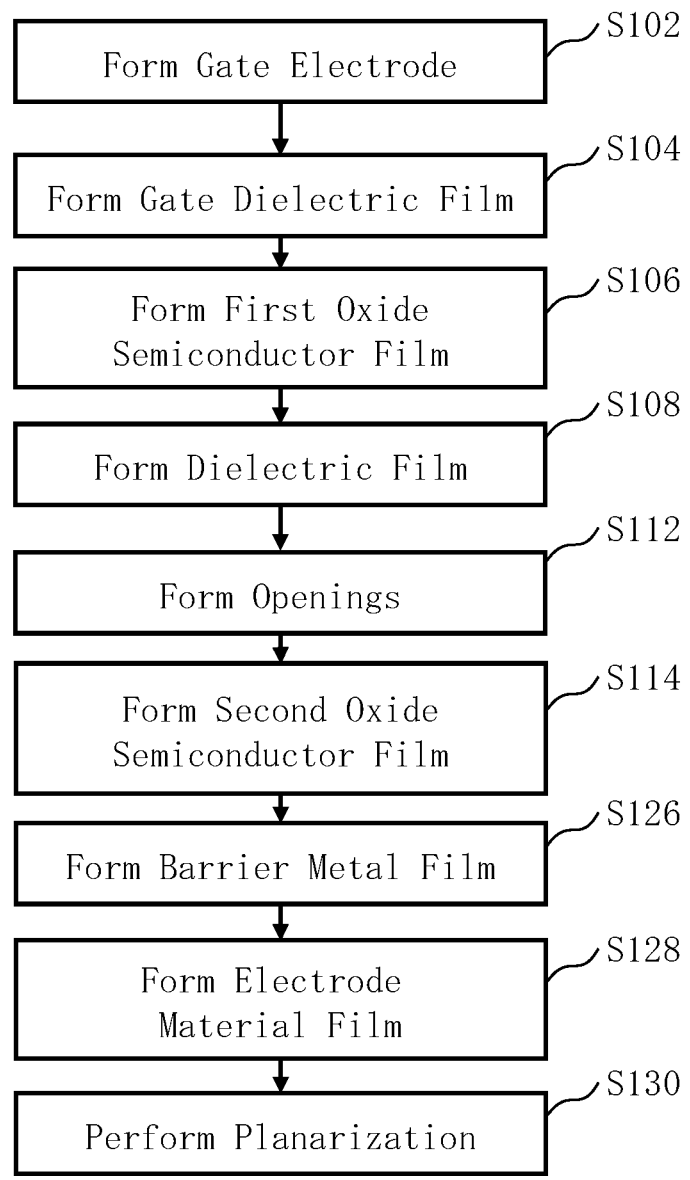
FIG. 5 is a flowchart illustrating main steps of a method for fabricating the semiconductor device according to the first embodiment.

FIG. 5 is a flowchart illustrating main steps of a method for fabricating the semiconductor device according to the first embodiment. In FIG. 5, in the method for fabricating the semiconductor device according to the first embodiment, a series of steps including a gate electrode forming step (S102), a gate dielectric film forming step (S104), a first oxide semiconductor film forming step (S106), a dielectric film forming step (S108), an opening forming step (S112), a second oxide semiconductor film forming step (S114), a barrier metal film forming step (S126), an electrode material film forming step (S128), and planarization step (S130) is performed. The barrier metal film forming step (S126), the electrode material film forming step (S128), and the planarization step (S130) are included in a source/drain electrodes forming step.

FIGS. 6A to 6D illustrate process sectional views of the method for fabricating the semiconductor device according to the first embodiment. FIGS. 6A to 6D illustrate from the gate electrode forming step (S102) to the dielectric film forming step (S108) in FIG. 5. Steps thereafter will be described later.

Figure 6A:
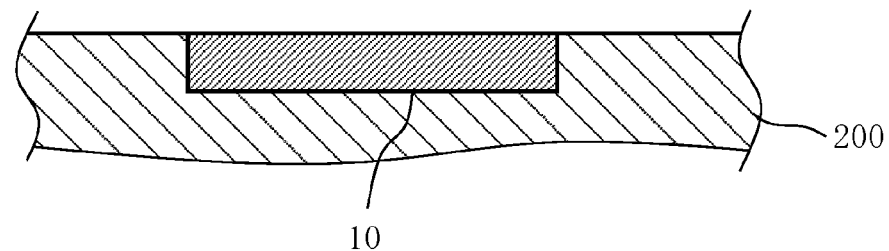
FIGS. 6A to 6D are process sectional views of the method for fabricating the semiconductor device according to the first embodiment.

In FIG. 6A, the gate electrode 10 is formed in the substrate 200 as the gate electrode forming step (S102). Apart of metal wires in the multilayer interconnection may be placed beside a transistor assuming that a TFT including an oxide semiconductor film is formed in multilayer interconnection. In an example of FIG. 6A, the gate electrode 10 is embedded in the substrate 200 through damascene process. For example, an opening (trench) for the gate electrode 10 is formed in the substrate 200. Then a gate electrode material is deposited on the substrate 200 so as to fill the opening. After the deposition, excessive gate electrode material that protrudes from the opening may be polished and removed through a chemical-mechanical polishing (CMP) process after the deposition. Through the step, the gate electrode 10 is formed. As a material of the gate electrode 10, copper (Cu), tantalum (Ta), tantalum nitride (TaN), titanium nitride (TiN), molybdenum (Mo), or the like may be used. Note that, when Cu is used, a barrier metal film is formed on the side surfaces and the bottom surface of the opening, and the gate electrode 10 may be formed to fill inside the trench through the barrier metal film in order to prevent diffusion of Cu into the substrate 200 or the like. As the substrate 200, for example, a silicon substrate composed of a silicon wafer having a diameter of 300 mm with a dielectric film, in which a gate electrode material is embedded, deposited thereon may be used. On the substrate 200, wires, various elements, and the like may be formed although they are not illustrated.

In an example of FIG. 6A, an embedded structure formed through damascene process is illustrated, but with materials other than Cu, which is difficult to be etched, the gate electrode 10 may be formed in other ways. The gate electrode 10 may be formed by depositing a gate electrode material on the substrate 200 through sputter process or the like, and then patterning by etching process.

Figure 6B:
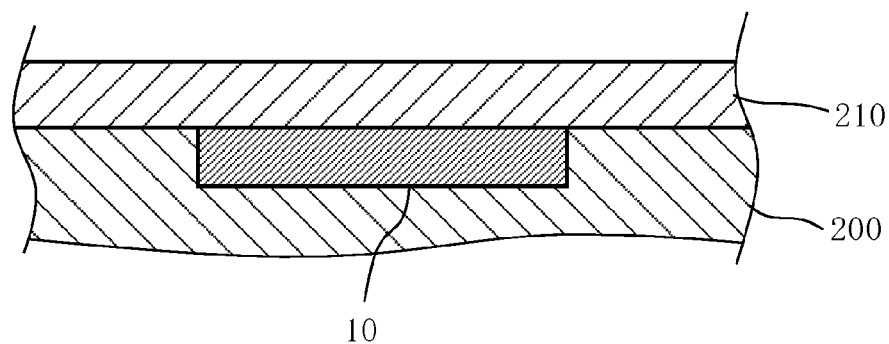

In FIG. 6B, as the gate dielectric film forming step (S104), the gate dielectric film 210 is formed to have a film thickness of, for example, 5 to 50 nm on the gate electrode 10 using chemical vapor deposition (CVD) process. Here, the gate dielectric film 210 is formed to have a film thickness of, for example, 15 nm. As a material of the gate dielectric film 210, silicon oxide ($SiO_2$), silicon nitride (SiN), silicon oxynitride (SiON), or the like may be preferably used. As a forming process, plasma CVD process, atomic layer deposition (ALD) process, or atomic layer chemical vapor deposition (ALCVD) process may be preferably used.

Figure 6C:
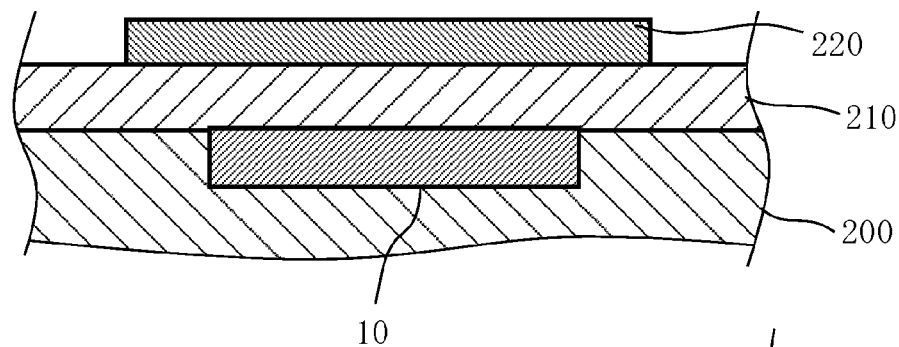

In FIG. 6C, as the first oxide semiconductor film forming step (S106), the oxide semiconductor film 220 is formed to have a film thickness of, for example, 10 to 30 nm on the gate dielectric film 210 using sputter process. Here, the oxide semiconductor film 220 is formed to have a film thickness of, for example, 30 nm. Thereafter, the oxide semiconductor film 220 is patterned by etching process in such a manner that an active region remains, whereby the oxide semiconductor film 220 of a predetermined size is formed. The oxide semiconductor film 220 is preferably formed to have a width in the gate length direction larger than that of the gate electrode 10. As a material of the oxide semiconductor film 220, an InGaZnO film, an InZnO film, a ZnO film, a ZnAlO film, a ZnCuO film, a NiO film, a SnO film, a CuO film, an InO film, or the like may be used as described above.

Figure 6D:
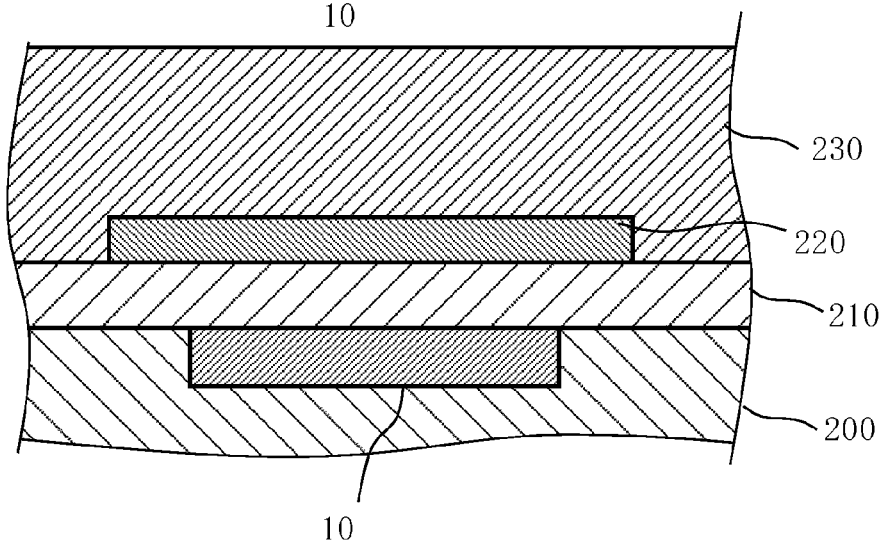

In FIG. 6D, as the dielectric film forming step (S108), the dielectric film 230 is formed on the oxide semiconductor film 220 and the gate dielectric film 210 to have a film thickness of, for example, 100 to 200 nm by using CVD process. Here, the dielectric film 230 is formed to have a film thickness of, for example, 150 nm on the gate dielectric film 210. As a material of the dielectric film 230, $SiO_2$, SiN, SiON, or the like may be preferably used. As a forming process, plasma CVD process, atomic layer deposition process, or atomic layer chemical vapor deposition process may be preferably used. The dielectric film 230 is formed to cover the oxide semiconductor film 220, and becomes a protective film of the oxide semiconductor film 220.

Figure 7A:
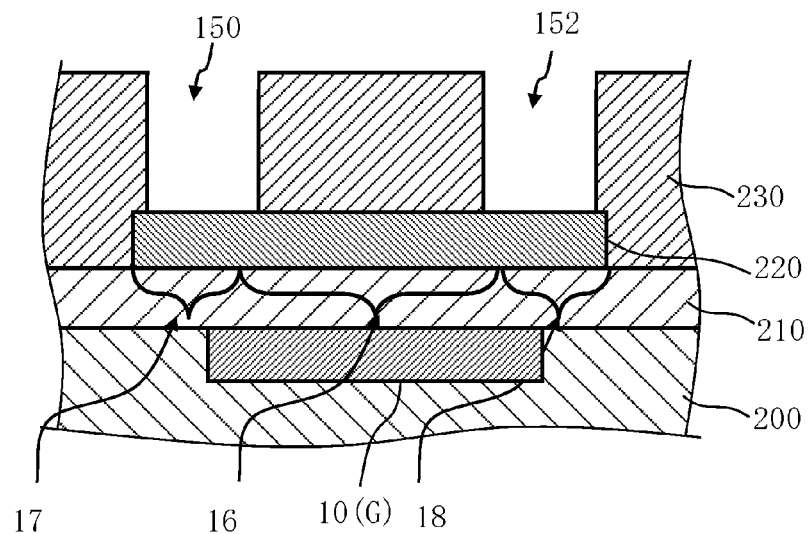
FIGS. 7A to 7C are process sectional views of the method for fabricating the semiconductor device according to the first embodiment.
Figure 7B:
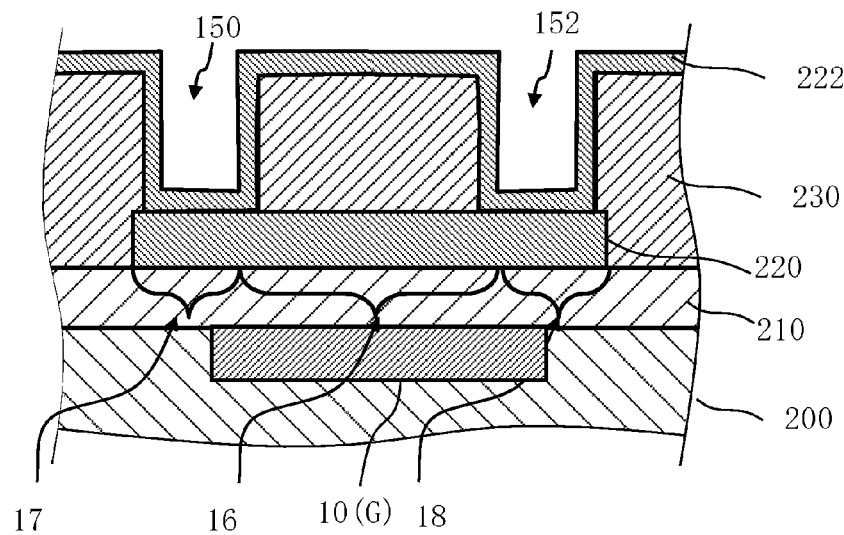
Figure 7C:
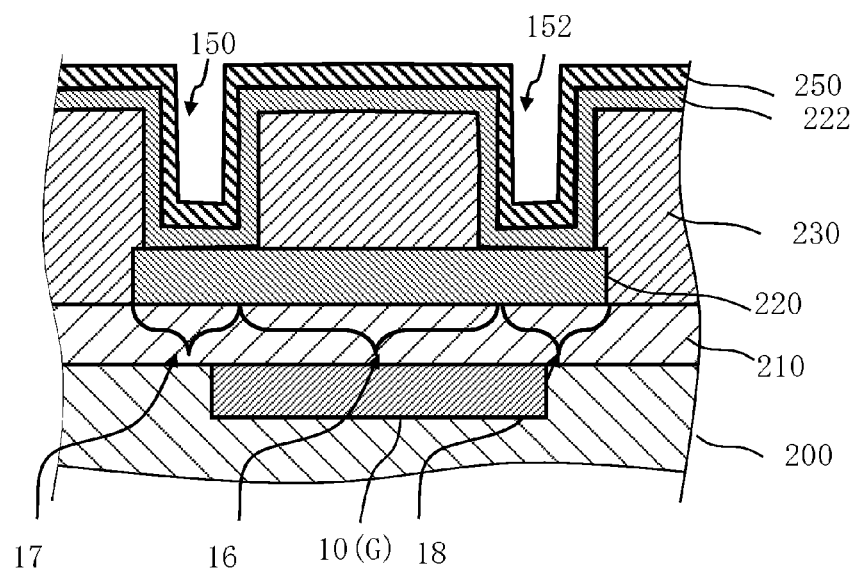

FIGS. 7A to 7C illustrate process sectional views of the method for fabricating the semiconductor device according to the first embodiment. FIGS. 7A to 7C illustrate from the opening forming step (S112) to the barrier metal film forming step (S126) in FIG. 5.

In FIG. 7A, as the opening forming step (S112), openings 150 and 152 are formed to penetrate through the dielectric film 230 from the top thereof to the surface of the oxide semiconductor film 220. The opening 150 (contact hole) for source is formed at a position where at least a part of the opening 150 overlaps with one end of the gate electrode 10 in the gate length direction. Meanwhile, the opening 152 (contact hole) for drain is formed at a position where at least a part of the opening 152 overlaps with the other end of the gate electrode 10 in the gate length direction. Since the oxide semiconductor film 222 is placed on the side surfaces and the bottom surfaces of the source electrode 30 and the drain electrode 40 in the first embodiment, the openings 150 and 152 are formed to have a large opening width considering the film thickness of the oxide semiconductor film 222. The openings 150 and 152 are formed to have a width of, for example, 1 µm or less for a dimension of electrodes. The openings 150 and 152 are formed to have a dimension obtained by adding the film thickness of the oxide semiconductor film 222 to the dimension of electrodes. The oxide semiconductor film 222 is formed to have a film thickness of about 10 to 70 nm as described later. Thus, each of the openings 150 and 152 may be formed to have a dimension obtained by adding the film thickness of the oxide semiconductor film 222 placed on both sides to the dimension of each electrode. Through lithography process, which is not illustrated, including a resist coating process, an exposure process, and the like, a resist pattern is formed on the dielectric film 230. The exposed parts of the dielectric film 230 above the substrate 200 are removed by an anisotropic etching process, whereby the openings 150 and 152 can be formed substantially perpendicular to the surface of the substrate 200. For example, the openings 150 and 152 may be formed by reactive ion etching (RIE) process.

In FIG. 7B, as the second oxide semiconductor film forming step (S114), the oxide semiconductor film 222 is deposited on the inner walls and the bottom surface of the openings 150 and 152, and on the dielectric film 230 to have a film thickness of, for example, 10 to 70 nm using sputter process. Here, the oxide semiconductor film 222 is formed to have a film thickness of, for example, 20 nm. As a material of the oxide semiconductor film 222, an InGaZnO film, an InZnO film, a ZnO film, a ZnAlO film, a ZnCuO film, a NiO film, a SnO film, a CuO film, an InO film, or the like may be used as described above. Here, for example, the material identical to that of the oxide semiconductor film 220 is used as a material of the oxide semiconductor film 222.

In the first embodiment, oxygen and nitrogen are doped to form the oxide semiconductor film 222. When the oxide semiconductor film 222 is formed by, for example, sputter process, sputtering may be performed in a gas atmosphere obtained by adjusting flow rates of oxygen gas and nitrogen gas. When only oxygen is doped, sputtering may be performed in an oxygen gas atmosphere obtained by setting oxygen concentration higher than that when the oxide semiconductor film 220 is formed. When only nitrogen is doped, sputtering may be performed in an atmosphere containing oxygen gas and nitrogen gas.

Particularly because the oxide semiconductor film 220 and the oxide semiconductor film 222 may be formed of the same constituent component, at least oxygen concentration should be set higher for the oxide semiconductor film 222 except for the interface portion with the source and drain electrodes than that for the oxide semiconductor film 220. In this case, the oxide semiconductor film 222 may be formed in oxygen concentration of, for example, about 50 atm % or less from the viewpoint of manufacturing. Oxygen concentration for the oxide semiconductor film 220 is preferably adjusted to concentration of about 15 to 25 atm %. By doping oxygen or/and nitrogen, diffusion of the reactant 11 can be prevented or suppressed. Thus, a margin of heat resistance can be improved. Therefore, the film thickness of the oxide semiconductor film 222 can be smaller than a case where oxygen or/and nitrogen is not supplied.

In FIG. 7C, as the barrier metal film forming step (S126), a barrier metal film 250 is deposited on the oxide semiconductor film 222 along the inner walls and the bottom surfaces of the openings 150 and 152 by using sputter process to have a film thickness of, for example, 10 to 30 nm. Here, the barrier metal film 250 is formed to have a film thickness of, for example, 10 nm. As the barrier metal film 250, a metal such as molybdenum (Mo) and tantalum nitride (TaN) may be used.

Figure 8:
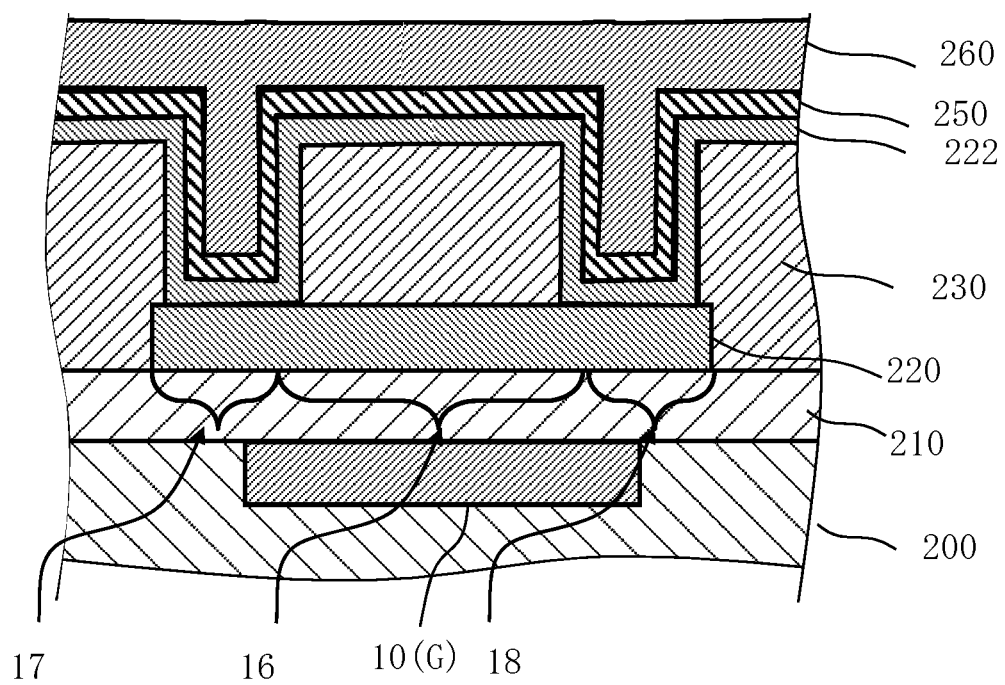
FIG. 8 is a process sectional view of the method for fabricating the semiconductor device according to the first embodiment.

FIG. 8 illustrates a process sectional view of the method for fabricating the semiconductor device according to the first embodiment. FIG. 8 illustrates the electrode material film forming step (S128) of FIG. 5.

In FIG. 8, as the electrode material film forming step (S128), an electrode material film 260 is deposited on the barrier metal film 250 to completely fill the openings 150 and 152 by using sputter process to have a film thickness of, for example, 200 to 400 nm. Here, the electrode material film 260 is formed to have a film thickness of, for example, 300 nm. As the electrode material film 260, aluminum (Al) may be preferably used when, for example, Mo is used as the barrier metal film 250. Copper (Cu) may be preferably used when, for example, TaN is used as the barrier metal film 250.

When Cu is used as the electrode material film 260, a seed film of Cu may be formed by sputter process to have a film thickness of, for example, 10 to 20 nm, and then, whole of the openings 150 and 152 may be filled with Cu by an electroplating process while using the seed film as a cathode. Then, after the deposition, annealing treatment may be performed for 30 minutes at, for example, 250° C.

When Al is used as the electrode material film 260, whole of the openings 150 and 152 may be filled by, for example, sputter process. Then, after the deposition, annealing treatment may be performed for 30 minutes at, for example, 250° C.

As the planarization process (S130), excessive parts of the electrode material film 260, the barrier metal film 250, and the oxide semiconductor film 222 that protrude from the openings 150 and 152 are polished and removed through a CMP process, whereby the barrier metal films 13 and 15 and the electrode material films 12 and 14 illustrated in FIG. 1 are formed, and thus the source electrode 30 and the drain electrode 40 are formed.

By annealing treatment upon formation of the electrode material film 260, or annealing treatment (for example, at 400° C. or more) in a process after the planarization process (S130), reactants 11 may be formed at the interface between the barrier metal film 13 of the source electrode 30 and the oxide semiconductor film 222s, and the interface between the barrier metal film 15 of the drain electrode 40 and the oxide semiconductor film 222d respectively. However, according to the first embodiment, it is possible to prevent the reactants 11 from diffusing to connect the source and the drain since the oxide semiconductor film 222s and the oxide semiconductor film 222d are separated in the horizontal direction. As a result, even with a short gate length, deterioration of threshold voltage can be prevented.

Second Embodiment

In the first embodiment, the oxide semiconductor film 222s covering the side surfaces and the bottom surface of the source electrode 30, and the oxide semiconductor film 222d covering the side surfaces and the bottom surface of the drain electrode 40 are used, but they are not necessarily used. In a second embodiment, there will be described a case where a second oxide semiconductor film to be connected to the bottom surfaces of the source electrode 30 and the drain electrode 40 is placed.

Figure 9:
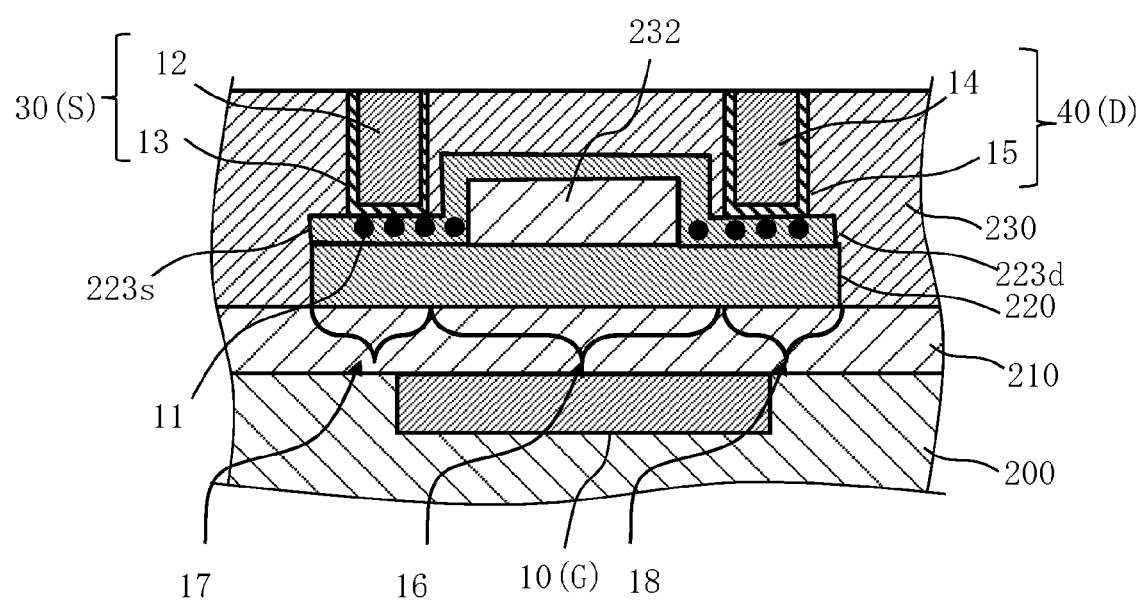
FIG. 9 is a sectional view illustrating a structure of a semiconductor device according to the second embodiment.

FIG. 9 is a sectional view illustrating a structure of a semiconductor device according to the second embodiment. In FIG. 9, as a semiconductor device, an example of a bottom-gate TFT using an oxide semiconductor film such as an IGZO film is illustrated. In FIG. 9, respective components including a substrate 200, a gate electrode 10, a gate dielectric film 210 (first dielectric film), an oxide semiconductor film 220 (first oxide semiconductor film) are similar to those in FIG. 1.

In the example of FIG. 9, a film pattern of a dielectric film 232 (third dielectric film) is placed on a channel region 16 of the oxide semiconductor film 220. Then, an oxide semiconductor film 223 (second oxide semiconductor film) is placed to cover the side surfaces and the top surface of the dielectric film 232, and the oxide semiconductor film 220 on the side surface side of the dielectric film 232.

With the structure described above, one end 223s of the oxide semiconductor film 223 (an example of the second oxide semiconductor film 223) connected to the bottom surface of the source electrode 30 is placed on one end side of the oxide semiconductor film 220, and the source electrode 30 is connected to the one end side of the oxide semiconductor film 220 via the one end 223s of the oxide semiconductor film 223. On the other end side of the oxide semiconductor film 220, the other end 223d of the oxide semiconductor film 223 (an example of the second oxide semiconductor film 223) connected to the bottom surface of the drain electrode 40 is placed, and the drain electrode 40 is connected to the other end side of the oxide semiconductor film 220 via the other end 223d of the oxide semiconductor film 223. The source electrode 30, the drain electrode 40, and the oxide semiconductor film 223 are placed in the dielectric film 230. The source electrode 30 is connected to the oxide semiconductor film 220 via the one end 223s of the oxide semiconductor film 223 at a position where at least a part of the source electrode 30 overlaps with one end of the gate electrode 10 in the gate length direction. The drain electrode 40 is connected to the oxide semiconductor film 220 via the other end 223d of the oxide semiconductor film 223 at a position where at least a part of the drain electrode 40 overlaps with the other end of the gate electrode 10 in the gate length direction.

The width of the dielectric film 232 in the gate length direction may be in a range larger than zero and equal to or less than a dimension obtained by subtracting two times of the film thickness of the oxide semiconductor film 223 from the gate length. As illustrated in FIG. 9, the width is required at least to insulate the one end 223d of the oxide semiconductor film 223 and the other end 223s of the oxide semiconductor film 223 from each other with respect to the lateral direction (direction parallel to the surface of the substrate 200).

As the oxide semiconductor film 223, an InGaZnO film, or the like may be preferably used. Other than an InGaZnO film, an InZnO film, a ZnO film, a ZnAlO film, a ZnCuO film, a NiO film, a SnO film, a CuO film, a GaAs film, an InO film, or the like may be used. The oxide semiconductor film 223 is preferably formed of a material identical to that of the oxide semiconductor film 220, but they may be formed of different materials as long as they are oxide semiconductors.

The source electrode 30 includes an electrode material film 12 as a main material and a barrier metal film 13 covering the side surfaces and the bottom surface of the electrode material film 12. Similarly, the drain electrode 40 includes an electrode material film 14 as a main material and a barrier metal film 15 covering the side surfaces and the bottom surface of the electrode material film 14.

As described above, in the second embodiment, the oxide semiconductor films 220 and 223 are formed as a multilayer film in contact regions 17 and 18 with the source electrode 30 and the drain electrode 40. Thus, the contact regions 17 and 18 are formed to have a thickness larger than that of the channel region 16 where a single-layer film of the oxide semiconductor film 220 is formed so that the source electrode 30 side and the drain electrode 40 side project.

More specifically, in the second embodiment, the oxide semiconductor film 220 (first oxide semiconductor film) is placed on the contact region 17 connected to the source electrode 30, the contact region 18 connected to the drain electrode 40, and the channel region 16 of the oxide semiconductor film 220. The oxide semiconductor film 223 (second oxide semiconductor film) is then placed on the oxide semiconductor film 220 so as to be in contact with the oxide semiconductor film 220 in the contact region 17 connected to the source electrode 30 and in the contact region 18 connected to the drain electrode 40. In other words, placing the dielectric film 232 allows forming the oxide semiconductor film 223 not to be in contact with the oxide semiconductor film 220 in the channel region 16 of the oxide semiconductor film 220.

Note that, in the example of FIG. 9, the oxide semiconductor film 223 covers the top surface of the dielectric film 232, but the oxide semiconductor film 223 is not necessarily placed on the dielectric film 232. More specifically, the oxide semiconductor film 223 is required to be in contact with at least the side surfaces of the dielectric film 232.

Figure 10:
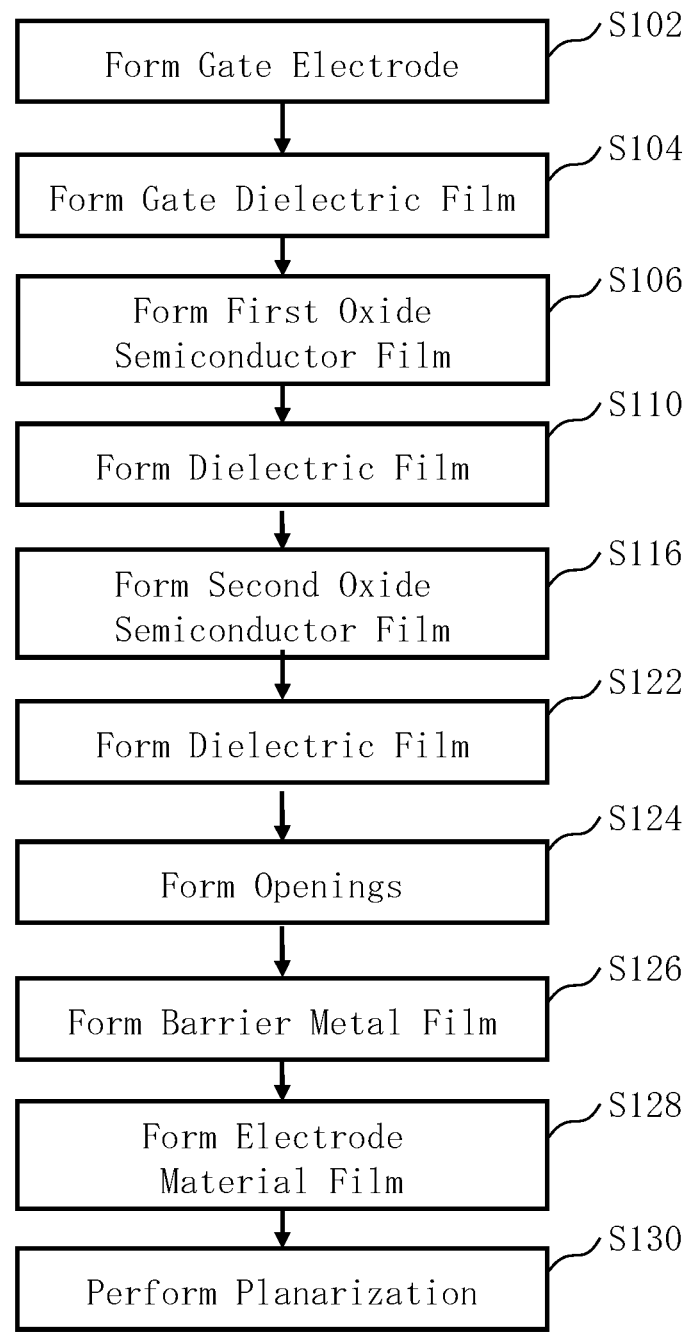
FIG. 10 is a flowchart illustrating main steps of a method for fabricating the semiconductor device according to the second embodiment.

FIG. 10 is a flowchart illustrating main steps of a method for fabricating the semiconductor device according to the second embodiment. In FIG. 10, in the method for fabricating the semiconductor device according to the second embodiment, a series of steps including a gate electrode forming step (S102), a gate dielectric film forming step (S104), a first oxide semiconductor film forming step (S106), a dielectric film forming step (S110), a second oxide semiconductor film forming step (S116), a dielectric film forming step (S122), an opening forming step (S124), a barrier metal film forming step (S126), an electrode material film forming step (S128), and a planarization step (S130) is performed. The barrier metal film forming step (S126), the electrode material film forming step (S128), and the planarization step (S130) are included in a source/drain electrodes forming step. Contents of respective steps from the gate electrode forming step (S102) to the first oxide semiconductor film forming step (S106) are similar to those in the first embodiment.

Figure 11A:
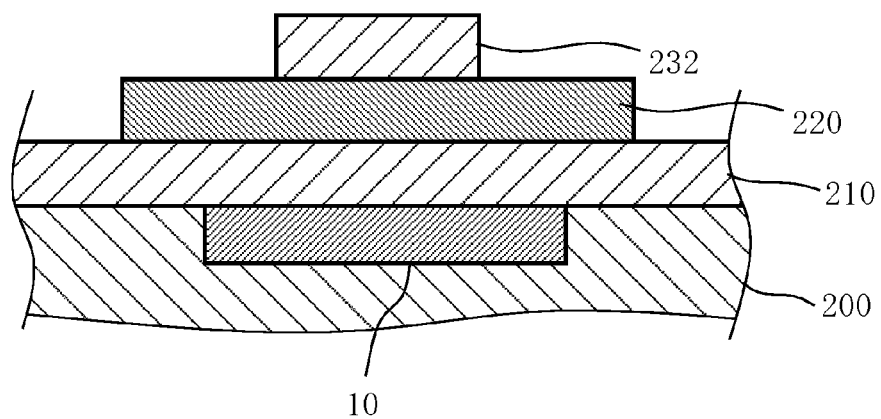
FIGS. 11A to 11C are process sectional views of the method for fabricating the semiconductor device according to the second embodiment.
Figure 11B:
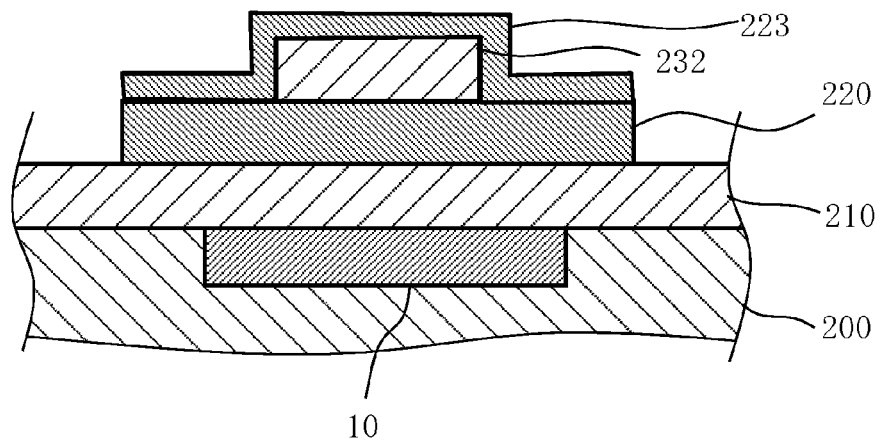
Figure 11C:
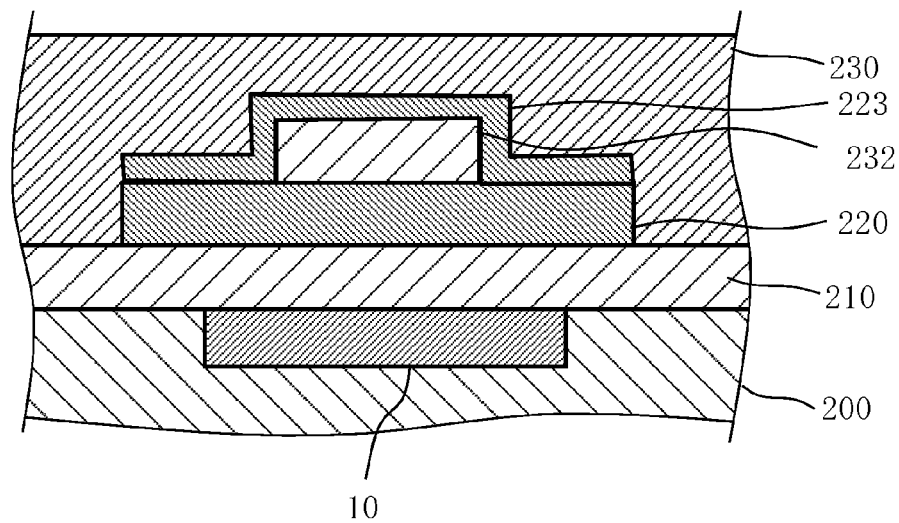

FIGS. 11A to 11C illustrate process sectional views of the method for fabricating the semiconductor device according to the second embodiment. FIGS. 11A to 11C illustrate from the dielectric film forming step (S110) to the dielectric film forming step (S122) in FIG. 10. Steps thereafter will be described later.

In FIG. 11A, as the dielectric film forming step (S110), the dielectric film 232 is formed on the oxide semiconductor film 220 and above the gate dielectric film 210 to have a film thickness of, for example, 10 to 30 nm by using CVD process. As a material of the dielectric film 232, $SiO_2$, SiN, SiON, or the like may be preferably used. As a forming process, plasma CVD process, atomic layer deposition process, or atomic layer chemical vapor deposition process may be preferably used.

Next, the dielectric film 232 is patterned in such a manner that a film pattern remains on the channel region 16 of the oxide semiconductor film 220. Through lithography process, which is not illustrated, including a resist coating process, an exposure process, and the like, a resist pattern is formed on the dielectric film 232. The exposed parts of the dielectric film 232 above the substrate 200 are removed by an anisotropic etching process, whereby the film pattern of the dielectric film 232 can be processed substantially perpendicular to the surface of the substrate 200. For example, the film pattern of the dielectric film 232 may be formed by RIE process. Note that, at least a part of the dielectric film 232, which is other than the film pattern illustrated in FIG. 9, is required to be removed from the oxide semiconductor film 220, and some of the dielectric film 232 may remain on the gate dielectric film 210.

In FIG. 11B, as the second oxide semiconductor film forming step (S116), the oxide semiconductor film 223 is deposited to have a film thickness of, for example, 10 to 70 nm on the top surface and the side surfaces of the dielectric film 232, on the oxide semiconductor film 220, and on the gate dielectric film 210 using sputter process. Here, the oxide semiconductor film 223 is formed to have a film thickness of, for example, 20 nm. As a material of the oxide semiconductor film 223, an InGaZnO film, an InZnO film, a ZnO film, a ZnAlO film, a ZnCuO film, a NiO film, a SnO film, a CuO film, an InO film, or the like may be used as described above. Here, for example, the material identical to that of the oxide semiconductor film 220 is used as a material of the oxide semiconductor film 223.

In the second embodiment, oxygen and nitrogen are doped to form the oxide semiconductor film 223 similarly to the first embodiment. Oxygen and nitrogen are doped in a way similar to the first embodiment. Note that, similarly to the first embodiment, only one of them, that is, only oxygen or only nitrogen may be doped, and neither oxygen nor nitrogen may be doped.

Next, the oxide semiconductor film 223 is patterned by etching process in such a manner that an active region remains, whereby the oxide semiconductor film 223 of a predetermined size is formed. The oxide semiconductor film 223 is required at least to cover the bottom surfaces of the source electrode 30 and the drain electrode 40, and is preferably formed to have a width in the gate length direction larger than that of the gate electrode 10. For example, the oxide semiconductor film 223 may have the width similar to that of the oxide semiconductor film 220.

In FIG. 11C, as the dielectric film forming step (S122), the dielectric film 230 is formed on the oxide semiconductor film 223 and the gate dielectric film 210 to have a film thickness of, for example, 100 to 200 nm by using CVD process. Here, the dielectric film 230 is formed to have a film thickness of, for example, 150 nm on the gate dielectric film 210. As a material of the dielectric film 230, $SiO_2$, SiN, SiON, or the like may be preferably used. As a forming process, plasma CVD process, atomic layer deposition process, or atomic layer chemical vapor deposition process may be preferably used. The dielectric film 230 is formed to cover the oxide semiconductor film 223, and becomes a protective film of the oxide semiconductor films 220 and 223.

Figure 12:
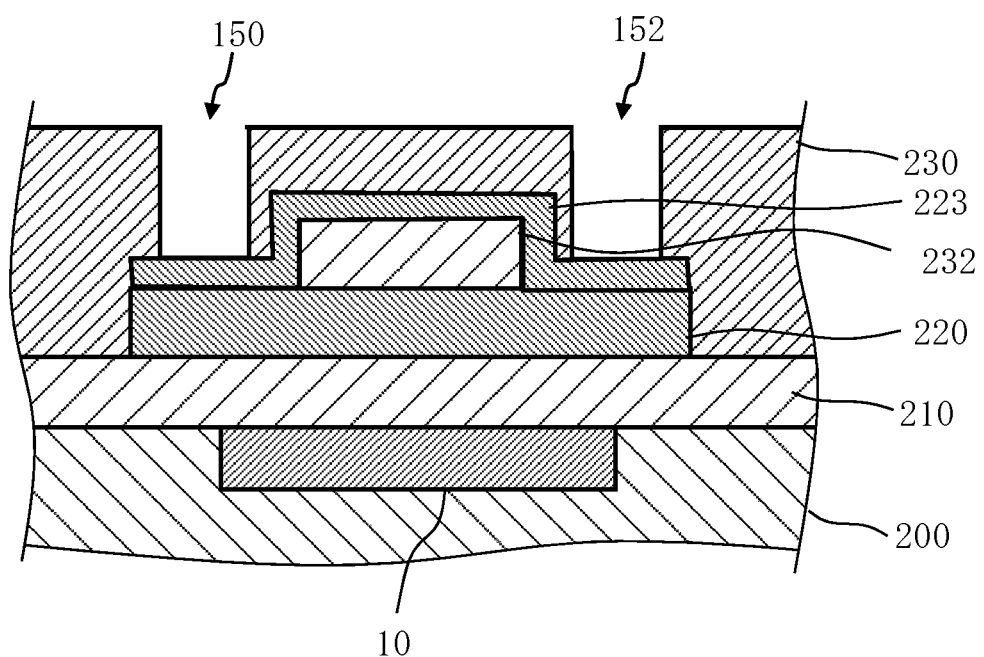
FIG. 12 is a process sectional view of the method for fabricating the semiconductor device according to the second embodiment.

FIG. 12 illustrates a process sectional view of the method for fabricating the semiconductor device according to the second embodiment. FIG. 12 illustrates the opening forming step (S124) of FIG. 10.

In FIG. 12, as the opening forming step (S124), openings 150 and 152 are formed to penetrate through the dielectric film 230 from the top thereof to the surface of the oxide semiconductor film 223. The opening 150 (contact hole) for source is formed at a position where at least a part of the opening 150 overlaps with one end of the gate electrode 10 in the gate length direction. Meanwhile, the opening 152 for drain is formed at a position where at least a part of the opening 152 overlaps with the other end of the gate electrode 10 in the gate length direction. Since the oxide semiconductor film 222 is not placed on the side surfaces of the source electrode 30 or the drain electrode 40 in the second embodiment, consideration of the film thickness of the oxide semiconductor film 222 is not required. The openings 150 and 152 are formed to have a width of, for example, 1 µm or less for a dimension of electrodes. Through lithography process, which is not illustrated, including a resist coating process, an exposure process, and the like, a resist pattern is formed on the dielectric film 230. The exposed parts of the dielectric film 230 above the substrate 200 are removed by an anisotropic etching process, whereby the openings 150 and 152 can be formed substantially perpendicular to the surface of the substrate 200. For example, the openings 150 and 152 may be formed by RIE process.

Thereafter, as the barrier metal film forming step (S126), a barrier metal film 250 is deposited on the inner walls and the bottom surfaces of the openings 150 and 152 and on the dielectric film 230 by using sputter process to have a film thickness of, for example, 10 to 30 nm. Other than the points described above, the barrier metal film forming step is similar to that of the first embodiment. The contents of the electrode material film forming step (S128) and the planarization step (S130) are similar to those of the first embodiment. However, it is needless to say that polishing for the oxide semiconductor film 223 is not required in the planarization step (S130) since the oxide semiconductor film 223 is not formed in the openings or on the dielectric film 230.

By annealing treatment upon formation of the electrode material film 260 in the electrode material film forming step (S128), or annealing treatment (for example, at 400° C. or more) in a process after the planarization process (S130), reactants 11 may be formed at the interface between the barrier metal film 13 of the source electrode 30 and the end 223s of the oxide semiconductor film 223, and the interface between the barrier metal film 15 of the drain electrode 40 and the end 223d of the oxide semiconductor film 223 respectively. However, according to the second embodiment, it is possible to prevent the reactant 11 from diffusing to connect the source and the drain since the end 223s and the 223d of the oxide semiconductor film 223 placed on the respective contact regions 17 and 18 are insulated from each other in the horizontal direction similarly to the first embodiment. As a result, even with a short gate length, deterioration of threshold voltage can be prevented.

Third Embodiment

In the second embodiment, there has been described a case where the dielectric film 232 is placed on the channel region 16, and the oxide semiconductor film 223 is formed on the dielectric film 232, but a semiconductor device can be fabricated in other ways. In a third embodiment, there will be described a case where separated second oxide semiconductor films to be connected respectively to the bottom surfaces of the source electrode 30 and the drain electrode 40 are placed.

Figure 13:
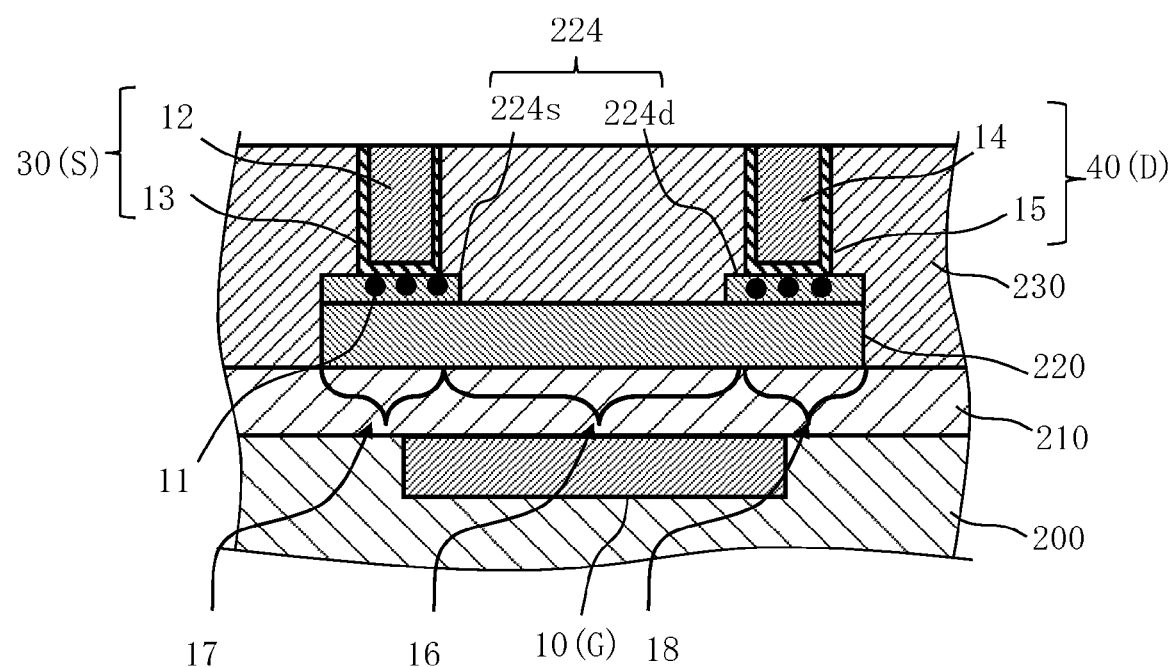
FIG. 13 is a sectional view illustrating a structure of a semiconductor device according to the third embodiment.

FIG. 13 is a sectional view illustrating a structure of a semiconductor device according to the third embodiment. In FIG. 13, as a semiconductor device, an example of a bottom-gate TFT using an oxide semiconductor film such as an IGZO film is illustrated. In FIG. 13, respective components including a substrate 200, a gate electrode 10, a gate dielectric film 210 (first dielectric film), and an oxide semiconductor film 220 (first oxide semiconductor film) are similar to those in FIG. 1.

In the example of FIG. 13, an oxide semiconductor film 224s (an example of a second oxide semiconductor film 224 and a third oxide semiconductor film) is placed on one end side of the oxide semiconductor film 220, and an oxide semiconductor film 224d (an example of a second oxide semiconductor film 224 and a fourth oxide semiconductor film) is placed on the other end side of the oxide semiconductor film 220. A source electrode 30 is connected to the one end side of the oxide semiconductor film 220 via the oxide semiconductor film 224s. A drain electrode 40 is connected to the other end side of the oxide semiconductor film 220 via the oxide semiconductor film 224d. The source electrode 30, the drain electrode 40, and the oxide semiconductor films 224s and 224d are placed in the dielectric film 230. The source electrode 30 is connected to the oxide semiconductor film 220 via the oxide semiconductor film 224s at a position where at least a part of the source electrode 30 overlaps with one end of the gate electrode 10 in the gate length direction. The drain electrode 40 is connected to the oxide semiconductor film 220 via the oxide semiconductor film 224d at a position where at least a part of the drain electrode 40 overlaps with the other end of the gate electrode 10 in the gate length direction.

As the oxide semiconductor films 224s and 224d, InGaZnO films, or the like may be preferably used. Other than InGaZnO films, InZnO films, ZnO films, ZnAlO films, ZnCuO films, NiO films, SnO films, CuO films, GaAs films, InO films, or the like may be used. The oxide semiconductor films 224s and 224d are preferably formed of a material identical to that of the oxide semiconductor film 220, but they may be formed of different materials as long as they are oxide semiconductors.

The source electrode 30 includes an electrode material film 12 as a main material and a barrier metal film 13 covering the side surfaces and the bottom surface of the electrode material film 12. Similarly, the drain electrode 40 includes an electrode material film 14 as a main material and a barrier metal film 15 covering the side surfaces and the bottom surface of the electrode material film 14.

As described above, in the third embodiment, the oxide semiconductor films 220 and 224 are formed as a multilayer film in contact regions 17 and 18 with the source electrode 30 and the drain electrode 40. Thus, the contact regions 17 and 18 are formed to have a thickness larger than that of a channel region 16 where a single-layer film of the oxide semiconductor film 220 is formed so that the source electrode 30 side and the drain electrode 40 side project.

More specifically, in the third embodiment, the oxide semiconductor film 224s (second oxide semiconductor film 224) is placed on the oxide semiconductor film 220 so as to be in contact with the oxide semiconductor film 220 (first oxide semiconductor film) in the contact region 17 connected to the source electrode 30. The oxide semiconductor film 224d (second oxide semiconductor film 224) is placed on the oxide semiconductor film 220 so as to be in contact with the oxide semiconductor film 220 in the contact region 18 connected to the drain electrode 40. In other words, the oxide semiconductor films 224s and 224d are formed so as to be insulated from each other on the oxide semiconductor film 220 in the channel region 16. The oxide semiconductor films 224s and 224d may have a width in the gate length direction causing the oxide semiconductor films 224s and 224d to extend into the channel region 16 as long as the oxide semiconductor films 224s and 224d are insulated from each other.

Figure 14:
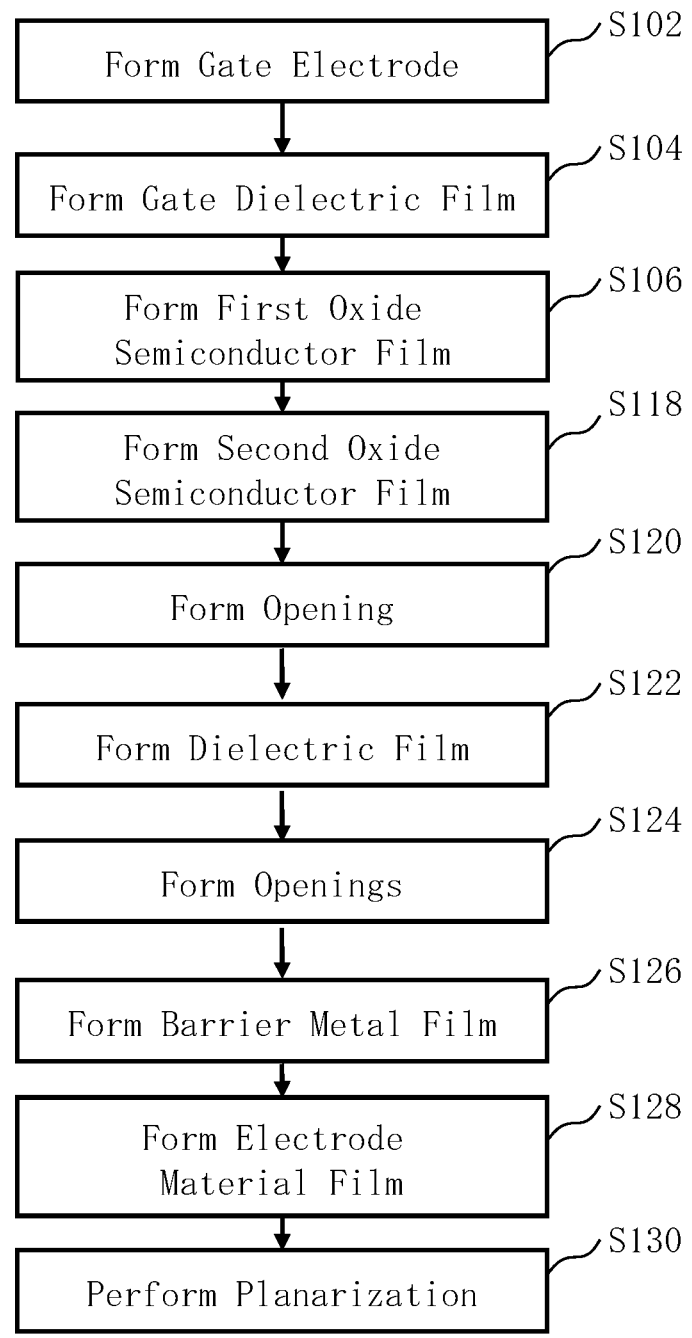
FIG. 14 is a flowchart illustrating main steps of a method for fabricating the semiconductor device according to the third embodiment.

FIG. 14 is a flowchart illustrating main steps of a method for fabricating the semiconductor device according to the third embodiment. In FIG. 14, in the method for fabricating the semiconductor device according to the third embodiment, a series of steps including a gate electrode forming step (S102), a gate dielectric film forming step (S104), a first oxide semiconductor film forming step (S106), a second oxide semiconductor film forming step (S118), an opening forming step (S120), a dielectric film forming step (S122), an opening forming step (S124), a barrier metal film forming step (S126), an electrode material film forming step (S128), and a planarization step (S130) is performed. The barrier metal film forming step (S126), the electrode material film forming step (S128), and the planarization step (S130) are included in a source/drain electrodes forming step. Contents of respective steps from the gate electrode forming step (S102) to the first oxide semiconductor film forming step (S106) are similar to those in the first embodiment.

Figure 15A:
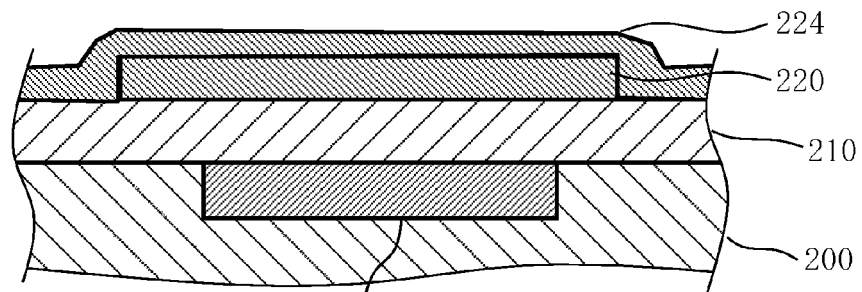
FIGS. 15A to 15C are process sectional views of the method for fabricating the semiconductor device according to the third embodiment.
Figure 15B:
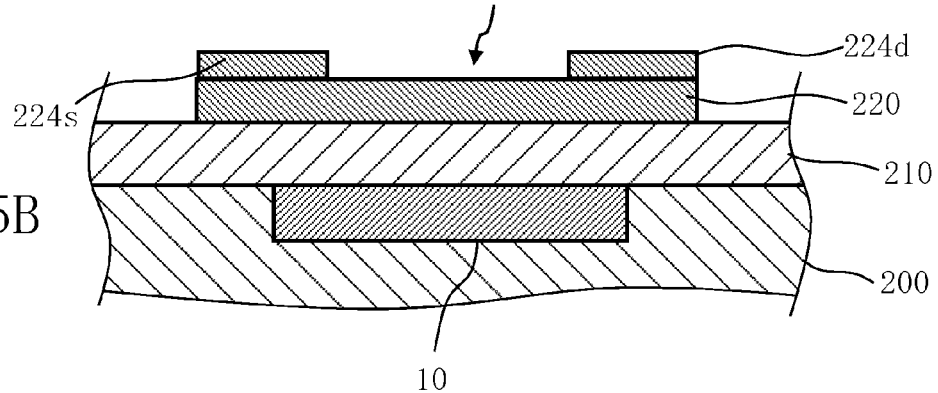
Figure 15C:
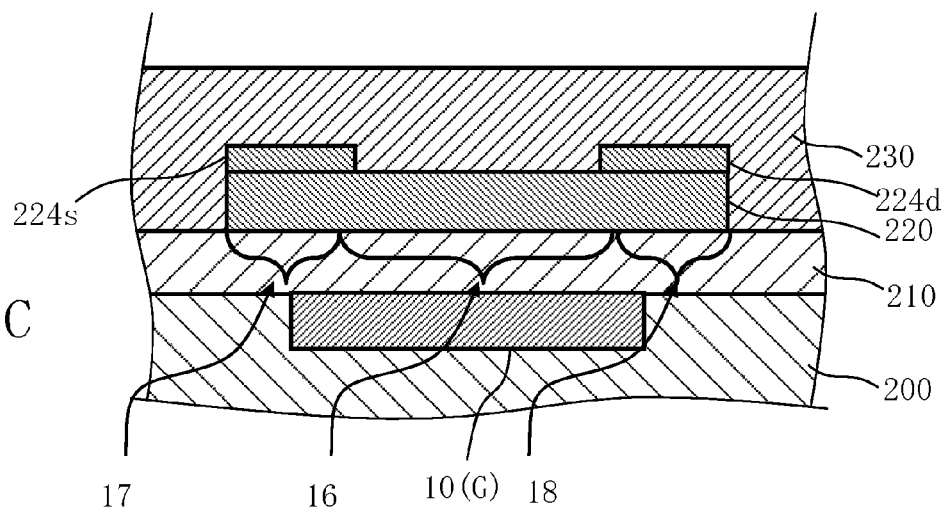

FIGS. 15A to 15C illustrate process sectional views of the method for fabricating the semiconductor device according to the third embodiment. FIGS. 15A to 15C illustrate from the second oxide semiconductor film forming step (S118) to the dielectric film forming step (S122) in FIG. 14. Steps thereafter will be described later.

In FIG. 15A, as the second oxide semiconductor film forming step (S118), an oxide semiconductor film 224 (second oxide semiconductor film) is deposited to have a film thickness of, for example, 10 to 70 mm on the oxide semiconductor film 220 and on the gate dielectric film 210 using sputter process. Here, the oxide semiconductor film 224 is formed to have a film thickness of, for example, 20 nm. As a material of the oxide semiconductor film 224, an InGaZnO film, an InZnO film, a ZnO film, a ZnAlO film, a ZnCuO film, a NiO film, a SnO film, a CuO film, an InO film, or the like may be used as described above. Here, for example, the material identical to that of the oxide semiconductor film 220 is used as a material of the oxide semiconductor film 224.

In the third embodiment, oxygen and nitrogen are doped to form the oxide semiconductor film 224 similarly to the first and second embodiments. Oxygen and nitrogen are doped in a way similar to the first embodiment. Note that, similarly to the first embodiment, only one of them, that is, only oxygen or only nitrogen may be doped, and neither oxygen nor nitrogen may be doped.

In FIG. 15B, as opening forming step (S120), the oxide semiconductor film 224 is patterned by etching process in such a manner that an active region remains, whereby the oxide semiconductor film 224 of a predetermined size is formed. The oxide semiconductor film 224 is required at least to cover the bottom surfaces of the source electrode 30 and the drain electrode 40, and is preferably formed to have a width in the gate length direction larger than that of the gate electrode 10. For example, the oxide semiconductor film 224 may have the width similar to that of the oxide semiconductor film 220.

Meanwhile, an opening 154 is formed in the oxide semiconductor film 224 in the channel region 16 of the oxide semiconductor film 220. Through lithography process, which is not illustrated, including a resist coating process, an exposure process, and the like, a resist pattern is formed on the oxide semiconductor film 224. The exposed parts of the oxide semiconductor film 224 above the substrate 200 are removed by an anisotropic etching process, whereby the opening 154 can be formed substantially perpendicular to the surface of the substrate 200. Since the oxide semiconductor film 220 and the oxide semiconductor film 224 can be formed of the same material, the depth of the opening 154 can be controlled by controlling etching time upon etching. The opening 154 is formed at least so as not to protrude from the channel region 16, and the opening 154 has at least the width in the gate length direction to allow the opening 154 to insulate the oxide semiconductor film 224s and the oxide semiconductor film 224d from each other. Therefore, the oxide semiconductor film 224s and the oxide semiconductor film 224d may extend in the channel region 16.

In addition, the patterning performed for the active region to remain and the patterning to form the opening 154 are not necessarily performed at the same time but may be performed as different processes.

In the third embodiment, the first oxide semiconductor film forming step (S106) and the second oxide semiconductor film forming step (S118) are performed as different processes but may be performed as a single process. For example, in the first oxide semiconductor film forming step (S106), the oxide semiconductor film 220 may be formed to have a thickness including that of the oxide semiconductor film 224. Then, the opening 154 may be formed not to penetrate through the part of the channel region 16 of the oxide semiconductor film 220 having such a large film thickness. Upon forming the oxide semiconductor film 220 for the thickness of the oxide semiconductor film 224, oxygen gas and/or nitride gas having an increased flow rate may be used as supply gas. In this way, oxygen and/or nitride is not doped upon formation of the oxide semiconductor film 220 but is doped upon formation of the oxide semiconductor film 224.

In FIG. 15C, as the dielectric film forming step (S122), the dielectric film 230 is formed on the oxide semiconductor films 224s and 224d, the oxide semiconductor film 220, and the gate dielectric film 210 to have a film thickness of, for example, 100 to 200 nm by using CVD process. Here, the dielectric film 230 is formed to have a film thickness of, for example, 150 nm on the gate dielectric film 210. As a material of the dielectric film 230, $SiO_2$, SiN, SiON, or the like may be preferably used. As a forming process, plasma CVD process, atomic layer deposition process, or atomic layer chemical vapor deposition process may be preferably used. The dielectric film 230 is formed to cover the oxide semiconductor films 224s and 224d, and the oxide semiconductor film 220, and becomes a protective film of the oxide semiconductor films 224s and 224d, and the oxide semiconductor film 220.

Figure 16:
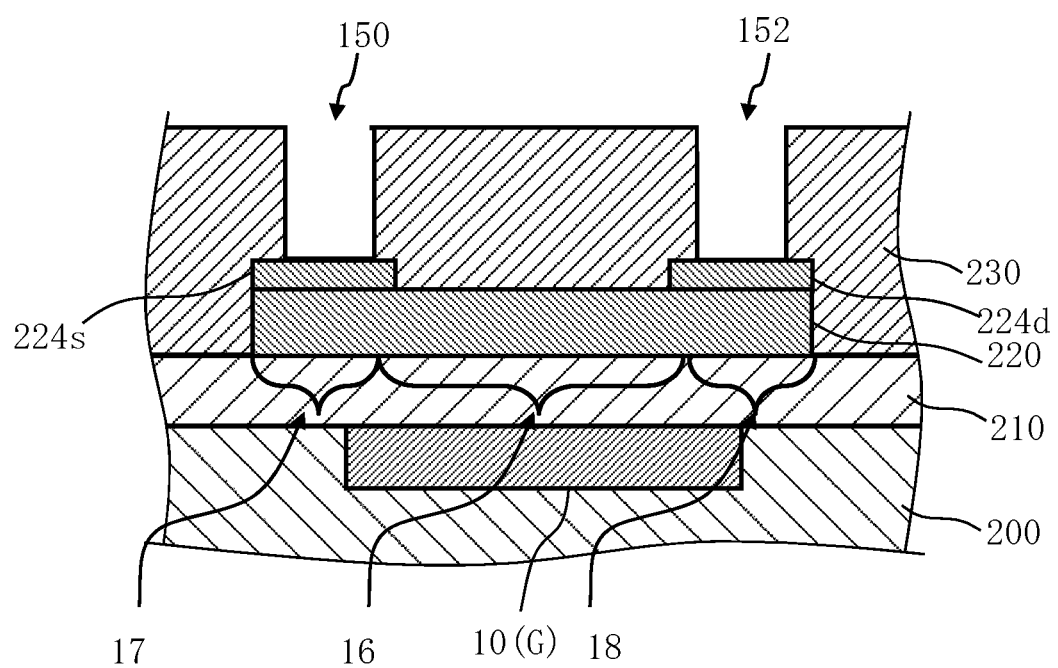
FIG. 16 is a process sectional view of the method for fabricating the semiconductor device according to the third embodiment.

FIG. 16 illustrates a process sectional view of the method for fabricating the semiconductor device according to the third embodiment. FIG. 16 illustrates the opening forming step (S124) of FIG. 14.

In FIG. 16, as the opening forming step (S124), the openings 150 and 152 are formed to penetrate through the dielectric film 230 from the top thereof to the surfaces of the oxide semiconductor films 224s and 224d. The contents of the opening forming step (S124) is similar to those of the second embodiment.

Contents of respective steps from the barrier metal film forming step (S126) to the planarization step (S130) are similar to those in the second embodiment.

According to the third embodiment, it is possible to prevent the reactant 11 from diffusing to connect the source and the drain since the oxide semiconductor film 224s and the oxide semiconductor film 224d are insulated from each other in the horizontal direction similarly to the first and second embodiments. As a result, even with a short gate length, deterioration of threshold voltage can be prevented.

The embodiments have been described with reference to the concrete examples. However, the invention is not limited to the concrete examples.

All other semiconductor devices and all other methods for fabricating a semiconductor device which include the elements of the present invention and can be obtained thorough arbitrary change in design by those skilled in the art are included in the spirit and scope of the invention.

Note that, to simplify the description, methods that are generally used in semiconductor industry including, for example, cleaning before and after each process are not described. However, it is obvious that those methods are included.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device comprising:
a gate electrode;
a first dielectric film placed above the gate electrode;
an oxide semiconductor film placed above the first dielectric film;
a second dielectric film placed above the oxide semiconductor film;
a source electrode placed in the second dielectric film and connected to the oxide semiconductor film; and
a drain electrode placed in the second dielectric film and connected to the oxide semiconductor film,
wherein the oxide semiconductor film is formed to have a film thickness in a first contact region in contact with the source electrode and a second contact region in contact with the drain electrode larger than a film thickness in a channel region of the oxide semiconductor film so that a film portion of the first contact region projects toward a source electrode side and a film portion of the second contact region projects toward a drain electrode side, and
wherein oxygen concentration of an upper portion of the first contact region, in contact with the source electrode, of the oxide semiconductor film and oxygen concentration of an upper portion of the second contact region, in contact with the drain electrode, of the oxide semiconductor film are higher than oxygen concentration of the channel region of the oxide semiconductor film, the upper portions being at positions higher than a to surface of the channel region.

2. The device according to claim 1, wherein nitrogen concentration of the upper portion of the first contact region, in contact with the source electrode, of the oxide semiconductor film and nitrogen concentration of the upper portion of the second contact region, in contact with the drain electrode, of the oxide semiconductor film are higher than nitrogen concentration of the channel region of the oxide semiconductor film.

3. The device according to claim 1, wherein the oxide semiconductor film includes:
a first oxide semiconductor film placed in the first contact region in contact with the source electrode, the second contact region in contact with the drain electrode, and the channel region; and
a second oxide semiconductor film placed in the first contact region in contact with the source electrode and the second contact region in contact with the drain electrode so as to be in contact with a top surface of the first oxide semiconductor film.

4. The device according to claim 3, wherein the second oxide semiconductor film is formed to insulate the source electrode side and the drain electrode side from each other in a gate length direction of the gate electrode.

5. The device according to claim 3, wherein oxygen concentration of the second oxide semiconductor film is higher than oxygen concentration of the first oxide semiconductor film.

6. The device according to claim 3, wherein the second oxide semiconductor film includes:
a third oxide semiconductor film in contact with the source electrode; and
a fourth oxide semiconductor film in contact with the drain electrode.

7. The device according to claim 6, wherein the third oxide semiconductor film and the fourth oxide semiconductor film are formed not to be connected to each other directly.

8. The device according to claim 6, wherein the third oxide semiconductor film is formed to cover a bottom surface and side surfaces of the source electrode.

9. The device according to claim 8, wherein oxygen concentration of a region of the third oxide semiconductor film covering the bottom surface of the source electrode is higher than oxygen concentration of the first oxide semiconductor film.

10. The device according to claim 6, wherein the fourth oxide semiconductor film is formed to cover a bottom surface and side surfaces of the drain electrode.

11. The device according to claim 10, oxygen concentration of a region of the fourth oxide semiconductor film covering the bottom surface of the drain electrode is higher than oxygen concentration of the first oxide semiconductor film.

12. The device according to claim 3, further comprising a third dielectric film placed on the channel region of the first oxide semiconductor film,
wherein the second oxide semiconductor film is formed to be in contact with at least side surfaces of the third dielectric film.

13. The device according to claim 12, wherein the second oxide semiconductor film is formed not to be in contact with the first oxide semiconductor film on the channel region of the first oxide semiconductor film.

14. A semiconductor device comprising:
a gate electrode;
a first dielectric film placed above the gate electrode;

an oxide semiconductor film placed above the first dielectric film;
a second dielectric film placed above the oxide semiconductor film;
a source electrode placed in the second dielectric film and connected to the oxide semiconductor film; and
a drain electrode placed in the second dielectric film and connected to the oxide semiconductor film,
wherein the oxide semiconductor film is formed to have a film thickness in a first contact region in contact with the source electrode and a second contact region in contact with the drain electrode larger than a film thickness in a channel region of the oxide semiconductor film so that a film portion of the first contact region projects toward a source electrode side and a film portion of the second contact region projects toward a drain electrode side,
wherein nitrogen concentration of an upper portion of the first contact region, in contact with the source electrode, of the oxide semiconductor film and nitrogen concentration of an upper portion of the second contact region, in contact with the drain electrode, of the oxide semiconductor film are higher than nitrogen concentration of the channel region of the oxide semiconductor film, the upper portions being at positions higher than a top surface of the channel region.

15. The device according to claim 14, wherein the oxide semiconductor film includes:
a first oxide semiconductor film placed in the first contact region in contact with the source electrode, the second contact region in contact with the drain electrode, and the channel region; and
a second oxide semiconductor film placed in the first contact region in contact with the source electrode and the second contact region in contact with the drain electrode so as to be in contact with a top surface of the first oxide semiconductor film.

16. The device according to claim 15, wherein the second oxide semiconductor film is formed to insulate the source electrode side and the drain electrode side from each other in a gate length direction of the gate electrode.

17. The device according to claim 15, wherein nitrogen concentration of the second oxide semiconductor film is higher than nitrogen concentration of the first oxide semiconductor film.

18. The device according to claim 15, wherein the second oxide semiconductor film includes:
a third oxide semiconductor film in contact with the source electrode; and
a fourth oxide semiconductor film in contact with the drain electrode.

19. The device according to claim 18, wherein the third oxide semiconductor film and the fourth oxide semiconductor film are formed not to be connected to each other directly.

20. The device according to claim 18, wherein the third oxide semiconductor film is formed to cover a bottom surface and side surfaces of the source electrode.

21. The device according to claim 20, wherein nitrogen concentration of a region of the third oxide semiconductor film covering the bottom surface of the source electrode is higher than nitrogen concentration of the first oxide semiconductor film.

22. The device according to claim 18, wherein the fourth oxide semiconductor film is formed to cover a bottom surface and side surfaces of the drain electrode.

23. The device according to claim 22, wherein nitrogen concentration of a region of the fourth oxide semiconductor film covering the bottom surface of the drain electrode is higher than nitrogen concentration of the first oxide semiconductor film.

24. The device according to claim 15, further comprising a third dielectric film placed on the channel region of the first oxide semiconductor film,
wherein the second oxide semiconductor film is formed to be in contact with at least side surfaces of the third dielectric film.

25. The device according to claim 24, wherein the second oxide semiconductor film is formed not to be in contact with the first oxide semiconductor film on the channel region of the first oxide semiconductor film.

* * * * *